United States Patent [19]

Sakai et al.

[11] Patent Number: 5,666,081
[45] Date of Patent: Sep. 9, 1997

[54] ON-DELAY CIRCUIT

[75] Inventors: Masayoshi Sakai; Koichi Futsuhara, both of Saitama-ken, Japan

[73] Assignee: The Nippon Signal Co., Ltd., Tokyo, Japan

[21] Appl. No.: 343,500

[22] PCT Filed: Mar. 31, 1993

[86] PCT No.: PCT/JP93/00410

§ 371 Date: Nov. 23, 1994

§ 102(e) Date: Nov. 23, 1994

[87] PCT Pub. No.: WO94/23496

PCT Pub. Date: Oct. 13, 1994

[51] Int. Cl.⁶ .................................................. H03K 17/292
[52] U.S. Cl. ........................ 327/402; 327/398; 361/89
[58] Field of Search .............................. 327/398, 402; 361/28, 89, 90

[56] References Cited

U.S. PATENT DOCUMENTS

| | | | |
|---|---|---|---|
| 3,689,807 | 9/1972 | Tenenbaum | 317/141 S |
| 3,796,061 | 3/1974 | Weihl | 361/28 |
| 3,814,948 | 6/1974 | Schuchmann et al. | 307/141 |
| 4,359,655 | 11/1982 | Fukui | 327/402 |
| 4,541,029 | 9/1985 | Ohyama | 361/90 |
| 4,661,880 | 4/1987 | Futsuhara | |
| 4,667,184 | 5/1987 | Futsuhara | |
| 5,027,114 | 6/1991 | Kawashima et al. | |

FOREIGN PATENT DOCUMENTS

| | | |
|---|---|---|
| 2493476 | 5/1982 | France . |
| 2740214 | 6/1978 | Germany . |
| 60-194826 | 10/1985 | Japan . |
| 60-199233 | 10/1985 | Japan . |
| 62-10310 | 5/1987 | Japan . |
| 1-23006 | 4/1989 | Japan . |
| 2-141122 | 5/1990 | Japan . |

OTHER PUBLICATIONS

"A Fail–Safe Logical Circuit Realization Using Asymmetrical Erroneous Elements", Koichi Futsuhara, The Transaction of th Institute of Electrical Engineers of Japan, vol. 104–C, No. 2, Feb. 1984.

"A Construction Method For An Interlock System Using A Fail–Safe Logic Element Having Window Characteristics", Koichi Futsuhara, et al., T. IEE Japan, vol. 109 C No. 9, Sep. 1989.

"Realization Of Fail–Safe Train Wheel Sensor Using Electromagnetic Induction", IEEE Transaction on Instrumentation and Measurement, vol. 38, No. 2, Apr. 1989.

(List continued on next page.)

*Primary Examiner*—Timothy P. Callahan
*Assistant Examiner*—Jung Ho Kim
*Attorney, Agent, or Firm*—Lowe, Price, LeBlanc & Becker

[57] ABSTRACT

The present invention relates to a fail-safe on-delay circuit which uses an an electronic circuit. An input signal higher than a power source potential is input to a PUT oscillating circuit and a pulse signal generated with a predetermined time constant, is once changed in a level conversion circuit to a level within a range of the power source potential, and then is phase inverted and a rising differential signal of the phase inverted signal is formed. The input signal to the PUT oscillation circuit is applied to one input terminal of a fail-safe two input window comparator, and the differential signal is input to the other input terminal, and self held. After a predetermined delay time an output of logic value 1 is generated from the window comparator. As a result a fail-safe on-delay circuit can be made wherein, in the event of a fault in the elements of the circuit the delay time is not shortened.

5 Claims, 9 Drawing Sheets

OTHER PUBLICATIONS

"LSI Implementation And Safety Verification Of Window Comparator Used In Fail–Safe Multiple–Valued Logic Operation", IEICE Trans. Electron., vol. E76–C, No. 3, Mar. 1993, pp. 419–427.

Patent Abstracts of Japan, vol. 011, No. 312, Oct. 12, 1987, JP–A–62104310.

"Application Of Window Comparator To Majority Operation", Proc. of 19th International Symp. on Multiple–Valued Logic, IEEE Computer Society, May 1989.

"Construction of Magnetic Sensors For Assuring Safety," M. Kato et al., Ergonomics of Hybrid Automated Systems II, pp. 913–920, 1990.

ON-DELAY CIRCUIT

TECHNICAL FIELD

The present invention relates to a fail-safe on-delay circuit which uses an electronic circuit, and wherein a pre-set delay time is not shortened in the event of a fault.

BACKGROUND ART

Heretofore, fail-safe on-delay circuits using a resistor and four terminal capacitor, as disclosed for example in U.S. Pat. No. 4,667,184 by Futsuhara, have been used for contactless type on-delay circuits employing conventional electronic circuits.

As shown in FIG. 1, such an on-delay circuit 1, comprises a resistor R1, a four terminal capacitor C1, and a two input window comparator WC which generates an output of logic value 1 when a signal of a level higher than a power source voltage is input to both input terminals A and B.

With this circuit, the input resistance of the window comparator is made sufficiently high compared to that of the resistor R1, so that when an input signal of y=1 (an input signal of a level higher than the power source potential Vcc) is input to a signal input terminal Uy of the on-delay circuit 1, the four terminal capacitor C1 is charged, and the charged voltage is applied to both input terminals A and B of the window comparator WC. When the signal level of the input to the input terminals A and B exceeds a threshold value pre-set for the window comparator WC and which is higher than the power source potential Vcc, the window comparator WC generates an output, and an output signal z=1 of logic value 1 is generated as the output of the on-delay circuit 1. Accordingly, with the on-delay circuit 1, the oscillation delay, that is the delay time of the on-delay circuit 1, is determined by the resistor R1, the four terminal capacitor C1 and the threshold value of the window comparator WC.

Another type of on-delay circuit using a UJT (unijunction transistor) is proposed by Futsuhara in Japanese Examined Patent Publication No. 1-3006, and in The Transaction of The Institute of Electrical Engineers of Japan Vol. 104-C, No.2 (February 1984) PP. 1~6.

With these on-delay circuits, the former on-delay circuit has a fail-safe construction, since in the event of a disconnection fault in the resistor, or a disconnection or short circuit fault in the terminals of the four terminal capacitor, an output is not generated. However, the time delay cannot be set very long. If a long time delay is required, then there is no other way but to use mechanical type timers such as a motor timer wherein the rotation of a motor is reduced in speed through a speed reducer to operate contact points.

With the latter on-delay circuit using a UJT, this has disadvantages such as; (1) erroneous signal generation due to a short circuit fault between the terminals of the UJT itself is not covered, and (2) since there is no threshold value operation function provided in the circuit which stores the delay pulse signal, the abovementioned erroneous signal generation cannot be dealt with.

The present invention takes into consideration the abovementioned situation with the object of providing a practical on-delay circuit using a fail-safe electronic circuit, which covers all possible failure modes.

DISCLOSURE OF THE INVENTION

The on-delay circuit of the present invention comprises; a PUT oscillation circuit for conducting a PUT (programmable uni-junction transistor) with a predetermined delay time from applying a signal to a signal input terminal, to generate an oscillating pulse, a level conversion circuit for level converting the signal level of the oscillating pulse from the PUT oscillation circuit, a two input window comparator for generating an output of logic value 1 when a signal input by way of the signal input terminal of the PUT oscillation circuit is applied to a first input terminal, a rising differential signal of the output from the level conversion circuit is applied to a second input terminal, and signals of a level higher than a power source potential are input to the first and second input terminals, and a self holding circuit which feeds back a rectified output of the two input window comparator to the second input terminal side, to thereby self hold the output of the window comparator.

With the on-delay circuit of such construction, the oscillating pulse is generated from the PUT with a delay time determined by the resistance value of first through third resistors, and the capacity of a capacitor. This pulse is phase inverted in the level conversion circuit and changed to a level within the frame of the power source, after which the rising differential signal is input to the second input terminal of the window comparator, so that an output is generated from the window comparator.

By this method of once converting the level of the oscillating pulse of the PUT oscillation circuit in the level converting circuit, and inputting the rising differential signal to the window comparator, then an output of logic value 1 will not be generated from the window comparator not only for a disconnection fault in the respective of the resistors, or for a disconnection or short circuit fault in the capacitor, but also with a short circuit fault between the terminals of the PUT. Also when the window comparator is faulty, an output of logic value 1 will not be generated. Hence a fail safe construction becomes possible.

Moreover, if a circuit for setting a time constant, comprising a resistor and four terminal capacitor, is provided prior to the first input terminal of the two input window comparator which takes the signal input by way of the signal input terminal of the PUT oscillation circuit, then even in the event of a multiple fault wherein several circuit components such as the resistors and capacitor(s) fail simultaneously, it is possible to maintain the fail-safe characteristics.

BEST MODE FOR CARRYING OUT THE INVENTION

As follows is a detailed description of embodiments of the present invention with reference to the drawings.

Figure 2:
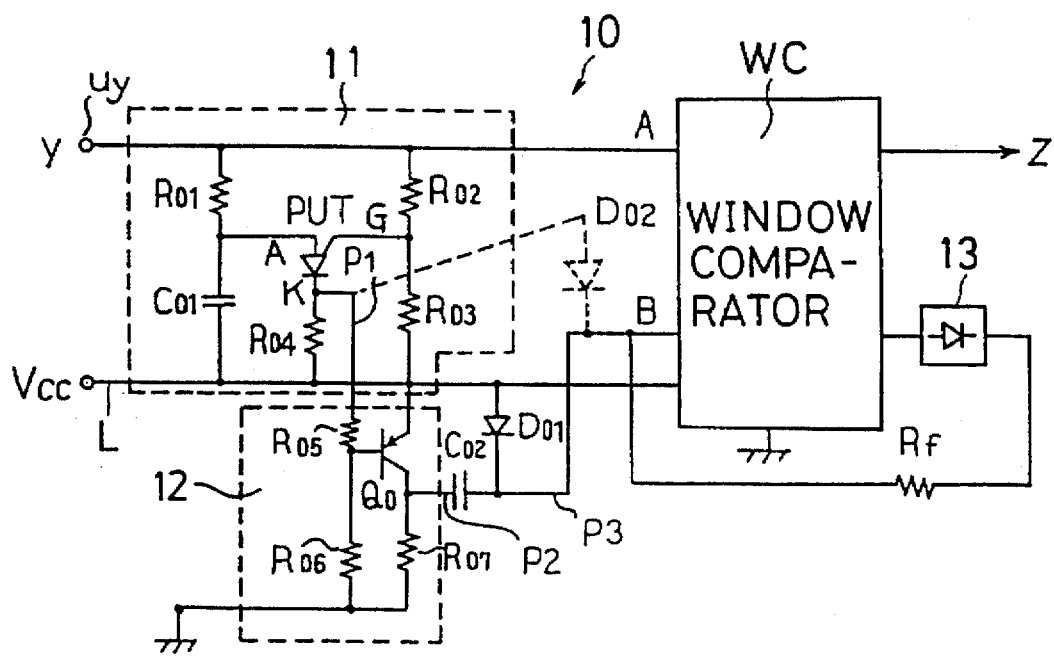
FIG. 2 is a circuit diagram illustrating a first embodiment of an on-delay circuit according to the present invention.

FIG. 2 shows an example of a practical fail-safe on-delay circuit using a CR circuit, illustrating a first embodiment of an on-delay circuit according to the present invention.

As shown in FIG. 2, an on-delay circuit 10 of the present invention comprises; a known PUT oscillation circuit 11 which conducts a PUT (programmable-uni-junction transistor) to generate an oscillating pulse with a predetermined delay time from applying a signal to a signal input terminal Uy, a level conversion circuit 12 for converting the output signal from the PUT oscillation circuit 11 so as to change below the power source potential Vcc, and inverting its phase, a two input window comparator (referred to hereunder as a window comparator) WC similar to the device of FIG. 1, which generates an output of logic value 1 when signals of a level higher than a power source potential are input together to a first input terminal A and a second input terminal B, and a self holding circuit comprising a rectifying circuit 13 for rectifying an output of the window comparator WC and a feedback resistor Rf which feeds back an output signal of the rectifying circuit 13 to the second input terminal B side.

The PUT oscillation circuit 11 has a series circuit of a first resistor $R_{O1}$ and a capacitor $C_{O1}$ connected between the signal input terminal Uy and a power supply line L to the window comparator, and has a series circuit of a second resistor $R_{O2}$ and a third resistor $R_{O3}$ connected in parallel with the series circuit of the first resistor $R_{O1}$ and the capacitor $C_{O1}$. The PUT anode terminal A is connected to an intermediate point between the first resistor $R_{O1}$ and the capacitor $C_{O1}$, and the PUT gate terminal G is connected to an intermediate point between the second resistor $R_{O2}$ and the third resistor $R_{O3}$. The PUT cathode terminal K is connected through a fourth resistor $R_{O4}$ to the power supply line L, and an oscillating pulse is generated from an intermediate point between the PUT cathode terminal K and the fourth resistor $R_{O4}$.

The level conversion circuit 12 has a fifth resistor $R_{O5}$ and a sixth resistor $R_{O6}$ for voltage dividing the oscillating pulse signal voltage from the PUT oscillation circuit 11, and incorporates a PNP transistor $Q_O$ with the emitter connected to the power supply line L of the window comparator WC, the collector connected through a seventh resistor $R_{O7}$ to earth, and the base connected to an intermediate point between the fifth resistor $R_{O5}$ and the sixth resistor $R_{O6}$. An output is generated from an intermediate point between the collector of the transistor $Q_O$ and the seventh resistor $R_{O7}$. A capacitor $C_{O2}$ and a diode $D_{O1}$ are used for producing a rising differential signal from the level conversion circuit 12 output signal, and inputting this into the second input terminal B of the window comparator WC.

The two input window comparator WC comprises a plurality of resistors and transistors, and is constructed so as to generate an output of logic value 1 corresponding to a high energy condition, only when signals of a predetermined level higher than the power source potential are input simultaneously to the two input terminals A and B. Moreover, it has a fail-safe construction, with the output becoming a logic value of "0" corresponding to a low energy condition, in the event of a fault. Such a fail-safe two input window comparator will be explained in detail later.

The operation of the on-delay circuit 10 will now be described using the time chart of FIG. 3.

Figure 3:
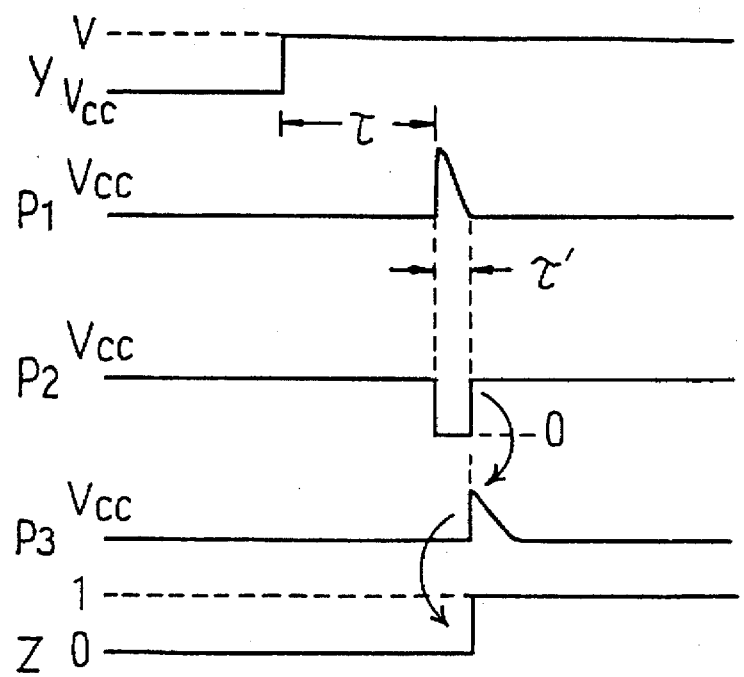
FIG. 3 is a diagram for explaining an operation of the on-delay circuit of FIG. 2.

When the input signal y=1 (input signal of a level higher than the power source potential Vcc that is, input signal of level V shown in FIG. 3) is supplied to the terminal Uy, this signal is input to the first input terminal A of the window comparator WC. As well as this, after a delay time τ provided to the input voltage V, determined by the time constant fixed by the resistance value of the first resistor $R_{O1}$ and the capacity of the capacitor $C_{O1}$, and by the divided voltage ratio for the second resistor $R_{O2}$ and the third resistor $R_{O3}$, the PUT conducts and an oscillating output $P_1$ is generated (the window of the first input terminal A of the window comparator WC is set so that the input level V is greater than the lower limit threshold value ThAL). This oscillating output $P_1$ is phase inverted by the transistor $Q_O$ to become an output signal P2, and the rising signal of the output signal $P_2$ is input to the second input terminal B of the window comparator WC by way of the capacitor $C_{O2}$ as a differential signal P3. When the signal $P_3$ is input to the window comparator WC, the window comparator WC oscillates, and the oscillating output signal is rectified by the rectifying circuit 13 and fed back to the input terminal B by way of a feedback resistor Rf. As a result, even if the differential signal $P_3$ of the signal $P_2$ is lost, the window comparator WC continues to oscillate until the input signal "y" becomes lower than the lower threshold value ThAL of the first input terminal A, while self holding the signal $P_3$.

The fail-safe construction of the on-delay circuit 10 of FIG. 2 will now be described.

In this respect, it is supposed that the resistors are susceptible to mechanical or heat failure, while the plates of the electrodes making up the capacitor are made from a non volatile material. There will therefore be a small change in temperature of the resistance value and the electrostatic capacity. However from the fail-safe point of view it is sufficient to consider the resistors with respect to disconnection faults only, and to consider the capacitors with respect to lead disconnection faults and short circuit faults between the electrode plates. Further, it is supposed that PUT oscillation circuit 11 and the level conversion circuit 12 are not such that there is occurrence of self oscillation in spite of there being no input signal. Then, the PUT oscillation circuit 11 will only oscillate and generate an output pulse $P_1$, when the elements constituting the circuit are in a normal condition, and the input signal "y" reaches a level exceeding the lower limit threshold value ThAL of the first input terminal A of the window comparator WC (for ease of understanding the threshold value of the upper limit is set sufficiently higher than the input signal level, however, even though set in this way, the function as a fail-safe on-delay circuit is not lost).

Moreover, even if for example a disconnection fault occurs in the first, second and third resistors $R_{O1}$, $R_{O2}$, $R_{O3}$, or the beforementioned disconnection or short circuit fault occurs in the capacitor $C_{O1}$, or a disconnection fault occurs in the three electrodes A (anode), K (cathode), and G (gate) of the PUT or a short circuit occurs between the electrodes, the output signal $P_1$ is not generated. However, since the fourth resistor $R_{O4}$ together with the capacitor $C_{O1}$ determines the pulse width τ' of the output signal P1, and a disconnection fault occurs in the fourth resistor $R_{O4}$, then the pulse width τ' of the signal P1 is increased. Hence, the delay period (τ+τ') of the on-delay circuit 10 becomes a little longer. However, since an increase in delay time is on the safe side, then this presents little problem.

The purpose of the level conversion circuit 12 is to change the pulse signal $P_1$ generated with a pulse level higher than power source potential Vcc, within the frame of the power source potential Vcc as shown by $P_2$ in FIG. 3. If the on-delay circuit is constructed with the oscillating output signal $P_1$ of the PUT led directly to the second input terminal B of the window comparator WC by way of the diode $D_{02}$ as indicated by the chain line of FIG. 2, then the level conversion circuit 12 can be omitted. However, if a disconnection fault occurs in the third resistor $R_{03}$, and furthermore a short circuit fault occurs between the gate G and the cathode K, then when the input signal "y" is input, the signal "y" is input directly to the first and second input terminals A and B of the window comparator WC. As a result, during the time that the delay period τ is not being produced, the window comparator WC oscillates, resulting in a dangerous situation. To prevent this danger, the signal $P_1$ is once converted to the signal $P_2$ which is within the frame of power source potential Vcc. This signal $P_2$ is then overlapped with the power source potential Vcc using the capacitor $C_{02}$ and the diode $D_{01}$ and input to the second input terminal B of the window comparator WC.

The level conversion circuit 12 has one more important function. The rising signal of signal $P_2$ as shown by $P_3$ in FIG. 3 is input to the second input terminal B of the window comparator WC. It means that the rising signal $P_3$ can generate an output pulse successively after the PUT oscillation circuit 11 oscillates and outputs the output signal $P_1$. In other words, this rising signal $P_3$, provides proof that the PUT oscillation circuit 11 is operating normally. Even in a worst case scenario where a disconnection fault occurs in the third resistor $R_{03}$ and the input signal "y" is supplied directly to the base of the transistor $Q_0$ by way of the second resistor $R_{02}$, and between the gate terminal G and the cathode terminal K of the PUT, then since the rising signal of the input signal "y" becomes the falling signal in the output signal $P_2$ of the transistor $Q_0$, then it does not become the signal $P_3$ transmitted by the capacitor $C_{02}$ and the diode $D_{01}$.

In the on-delay circuit 10 of FIG. 2, the first input terminal A of the window comparator WC compensates for the weakness of the PUT oscillation circuit 11. In this regard, the delay operation of the PUT oscillation circuit 11 will be described with reference to the time chart of FIG. 4.

Figure 4:
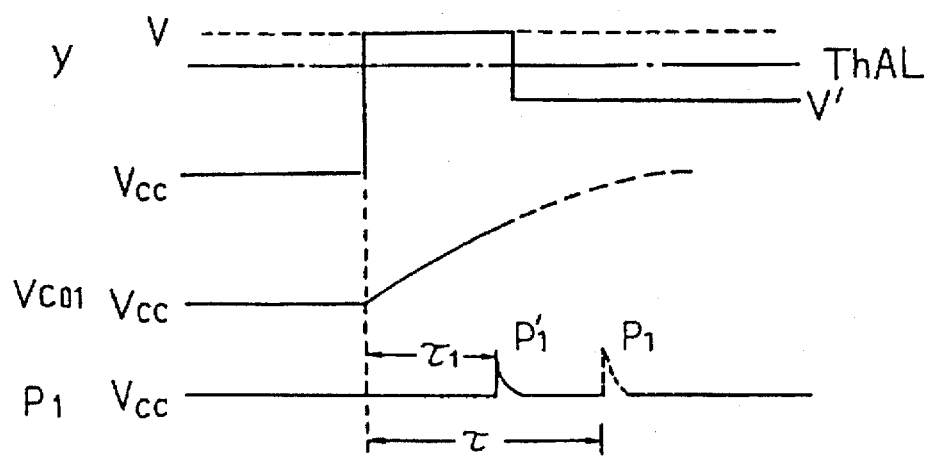
FIG. 4 is a diagram for explaining the fail-safe characteristics of the circuit of FIG. 2.

In FIG. 4, symbol $Vc_{01}$ indicates the change in the terminal voltage of the capacitor $C_{01}$ on the first resistor $R_{01}$ side. The setting of the circuit is such that the input signal "y" rises to voltage V while charging the capacitor $C_{01}$ through the first resistor $R_{01}$, and then after τ seconds, the output signal $P_1$ is generated. However if in a worst case situation, the level V of the input signal "y" drops to V' before the τ seconds has elapsed, and the potential of the gate terminal G of the PUT drops accordingly with the change in input level, then an output pulse $P_1'$ occurs at the point in time of τ1, prior to the τ seconds. Here if the lower limit threshold value ThAL of the first input terminal A of the window comparator WC is set so that the input level V' becomes lower than the lower limit threshold value ThAL of the first input terminal A, then even in the worst case where there is a level change in the input signal "y" from V to V', and the pulse $P_1'$ is input to the second input terminal B at the point in time of τ1, prior to the predetermined time τ, the window comparator WC will not oscillate.

Hence, the threshold value ThAL of the first input terminal A, determines the minimum value of the delay time τ.

Needless to say a UJT (uni-junction transistor, also referred to as a double base diode) can be used instead of a PUT.

In the construction of the on-delay circuit 10 of FIG. 2, an input signal "y" greater than the power source potential Vcc is input, and an oscillation pulse $P_1$ which is output at a potential higher than the power source potential Vcc is once converted into a pulse $P_2$ which changes within the frame of the power source potential Vcc. This pulse $P_2$ is then converted to a pulse $P_3$ having a potential higher than the power source potential Vcc, to become an input signal to the second input terminal B of the window comparator WC. Due to this conversion, the construction is such that only when a pulse $P_2$ arises in the level conversion circuit 12 is the pulse $P_3$ input as a trigger signal to the second input terminal B of the window comparator WC.

Figure 5:
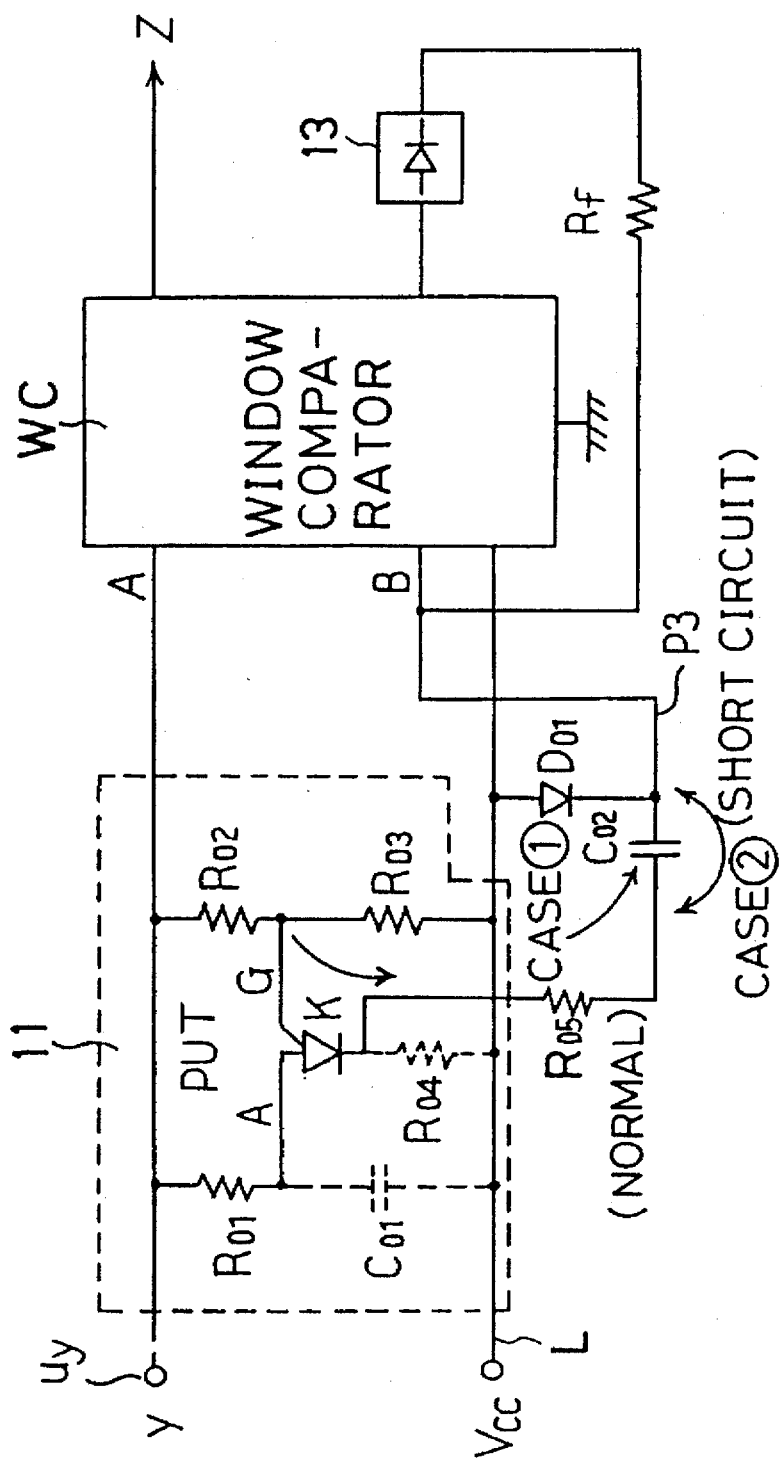
FIG. 5 is a diagram illustrating an example of a supposed failure mode for the on-delay circuit of FIG. 2.
Figure 6:
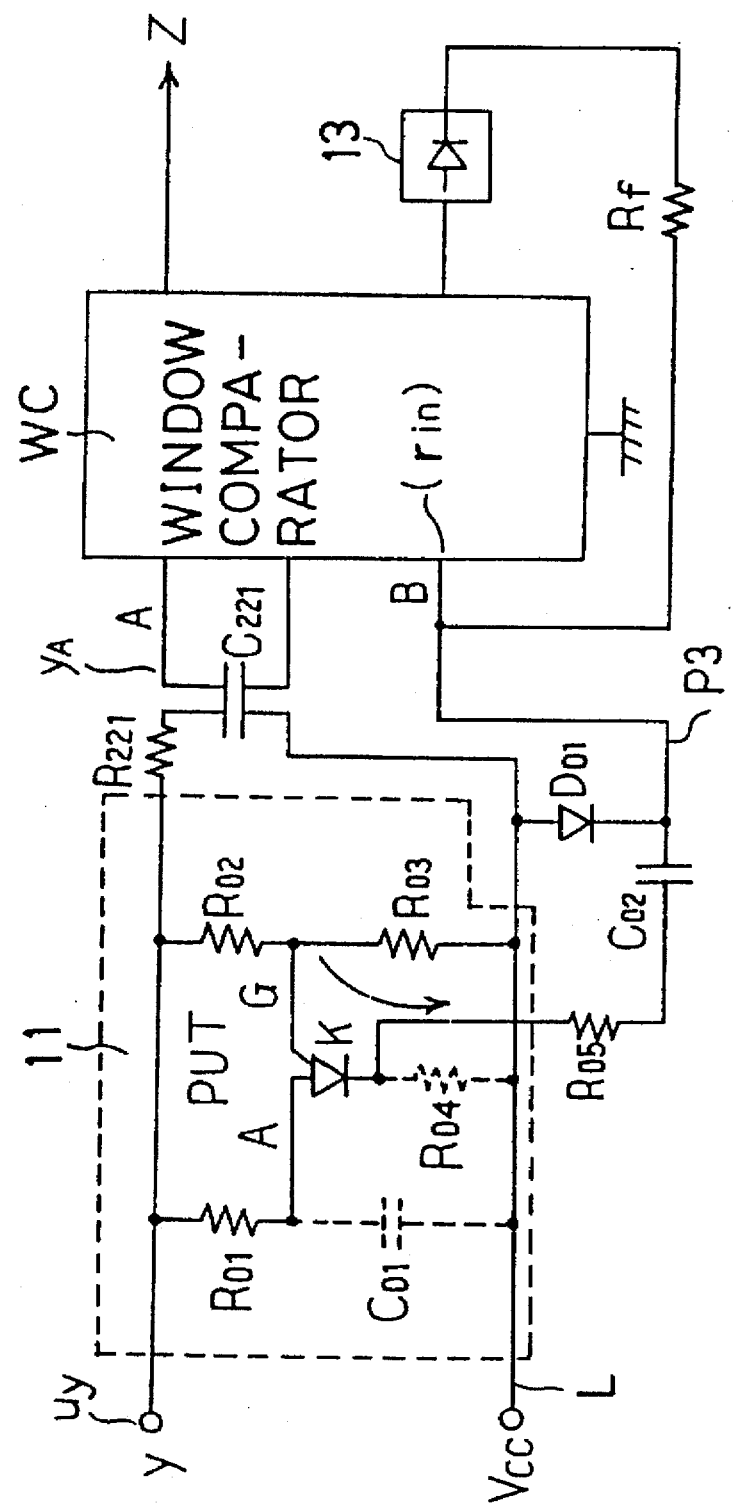
FIG. 6 is a circuit diagram for dealing with the failure mode of FIG. 5.

However, when a disconnection fault occurs for example in the fourth resistor $R_{04}$, the sixth resistor $R_{06}$, and the seventh resistor $R_{07}$, and the capacitor $C_{01}$, and a disconnection fault occurs in the collector of the transistor $Q_0$, then the on-delay circuit 10 of FIG. 2 essentially becomes that of FIG. 5. In practice, such a multiple failure is not likely to occur at the same time. However in the case where, due to a fault in the components of the circuit, a signal higher than the power source potential Vcc is erroneously input to the second input terminal B of the window comparator WC, then at this time the circuit becomes that of FIG. 5. To positively ensure that under these highly unfavourable conditions an incorrect output signal of z=1 is not produced, then as shown in FIG. 6 a delay circuit similar to that of FIG. 1 comprising a resistor $R_{221}$ and a four terminal capacitor $C_{221}$, is inserted in the on-delay circuit 10 of FIG. 2 prior to the first input terminal A of the window comparator WC. Moreover, the upper and lower limit threshold values ThBH and ThBL can be set a fault in the second input terminal B in consideration of faults.

With such a circuit, then in a worst case situation as illustrated by FIG. 5, the case indicated by (1) for where the capacitor $C_{02}$ is operating normally, can be distinguished from the case indicated by (2) for the short circuit fault in the capacitor $C_{02}$.

Figure 7:
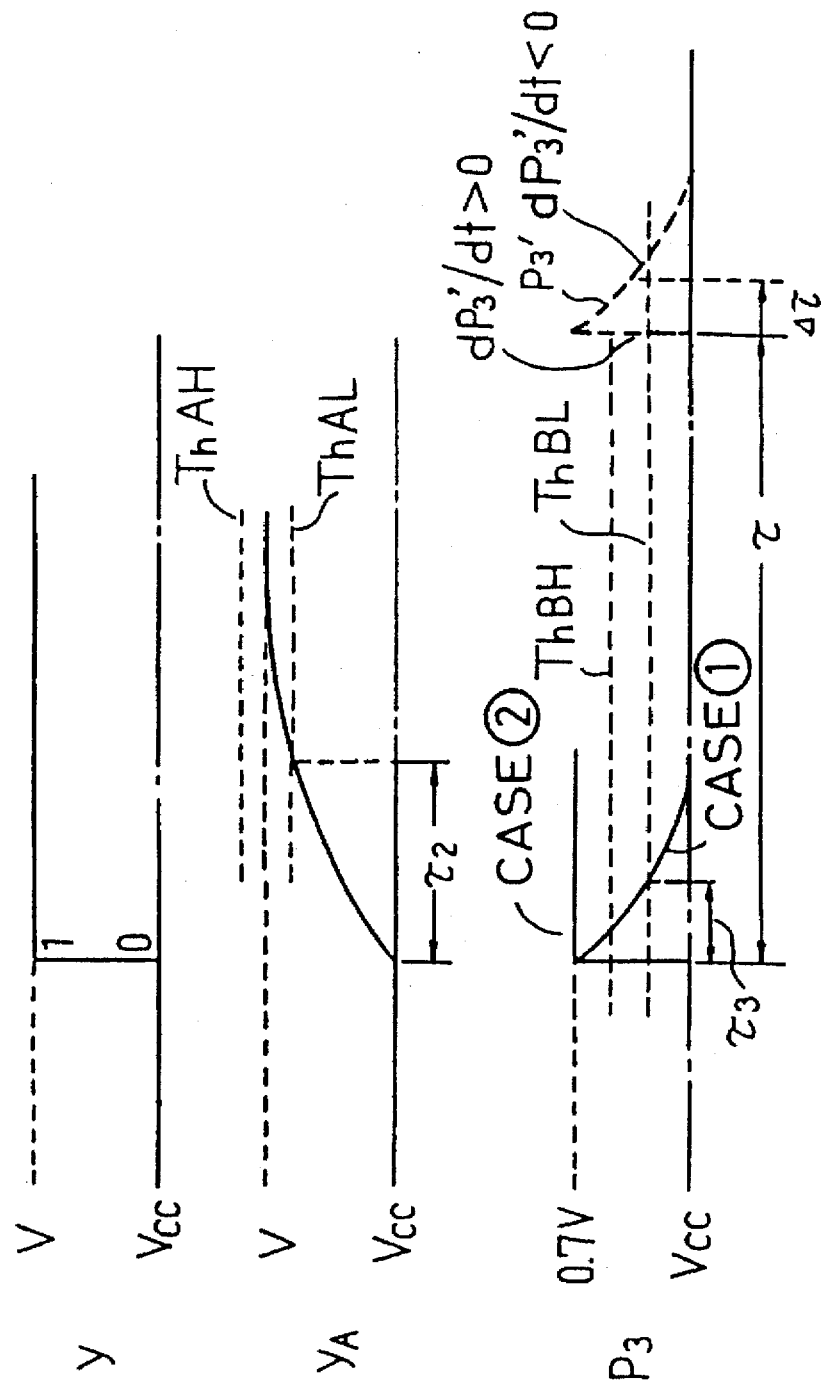
FIG. 7 is a diagram for illustrating an operation of the circuit of FIG. 6.

Case (1) as shown in the time chart of FIG. 7 by the waveform (1) of $P_3$, is for when the rising signal (differential signal) of the input signal "y" is input passing between the anode terminal A and the cathode terminal K, or between the gate terminal G and the cathode terminal K of the PUT. If this differential signal $P_3$ attains a level that satisfies the oscillation conditions at the second input terminal B of the window comparator WC, then in the case where due to the abovementioned multiple failure the circuit construction becomes that of FIG. 5, the window comparator WC produces an output signal of z=1 simultaneously with input of the input signal "y" (a delay time of τ does not occur). The resistor $R_{221}$ and the four terminal capacitor $C_{221}$ of FIG. 6 are inserted to avoid this. The resistor $R_{221}$ and the four terminal capacitor $C_{221}$ have the same function as for the case of the resistor $R_1$ and the four terminal capacitor $C_1$ in FIG. 1.

In this respect, the signal (shown as $y_A$ in FIG. 6) for input to the first input terminal A of the window comparator WC, as shown in FIG. 7 reaches the lower limit threshold value ThAL, τ2 seconds (τ2 is a time constant determined by the resistor $R_{221}$ and the four terminal capacitor $C_{221}$) after input of the input signal y=1 (signal for level V). Here if the lower limit threshold value ThBL of the second input terminal B of the window comparator WC is set so that the time τ3 taken from the rise of the signal $P_3$ until it becomes less than the lower limit threshold value ThBL set for the second input terminal B of the window comparator WC, becomes shorter than the above time constant τ2, then even if the signal $P_3$ is generated due to the rising of the input signal y=1, an output signal of z=1 does not occur.

The situation of case (2) wherein a short circuit fault occurs in the capacitor $C_{02}$ will now be described.

Here the input resistance of the second input terminal B of the window comparator WC is made $r_{in}$, the resistance values of the resistors $R_{01}$, $R_{02}$, $R_{03}$, $R_{04}$, $R_{05}$ are made $r_{01}$, $r_{02}$, $r_{03}$, $r_{04}$, $r_{05}$, and under normal conditions $r_{01} \gg r_{in} \gg r_{02}$, $r_{03}$, $r_{04} \gg r_{05}$. In an extreme condition where a short circuit fault occurs between the anode terminal A and cathode terminal K of the PUT, then since $r_{01} \gg r_{in}$, the input voltage to the second input terminal B drops, so that the lower limit threshold value ThBL can become higher than this input voltage. Subsequently, when as another different extreme condition, a short circuit fault occurs between the gate terminal G and the cathode terminal K of the PUT, the signal comprised of the input voltage V which is voltage divided by the resistors $R_{02}$ and $R_{03}$, is input to the second input terminal B.

Since generally, this voltage divided ratio (resistance value ratio $r_{02}/r_{03}$) is approximately 0.7, then this is shown as 0.7 V in the time chart of FIG. 7. Consequently, the upper limit threshold value ThBH of the second input terminal B of the window comparator WC may be set to a value which is lower than this input voltage (for example 0.5 V). If a disconnection fault occurs in the resistor $R_{03}$ shown in FIG. 5, then an input voltage larger than the beforementioned 0.7 V is input to the second input terminal B of the window comparator WC. Moreover, when a short circuit fault occurs simultaneously between the anode terminal A and the cathode terminal K, and the gate terminal G and the cathode terminal K of the PUT, then since $r_{01} \gg r_{02}$, this short circuit fault condition is approximately equivalent to the short circuit conditions between the gate terminal G and the cathode terminal K. Furthermore, under conditions wherein there is no disconnection fault in the resistor $R_{04}$, then since $r_{04} \ll r_{02}$ and $r_{001}$, the input voltage of the second input terminal B of the window comparator WC is at a low level.

With the on-delay circuit shown in FIG. 6 comprising the resistor $R_{221}$ and four terminal capacitor $C_{221}$ attached to the on-delay circuit 10 of FIG. 2, then under normal conditions with no faults, a signal (shown as $P_3'$ in FIG. 7) is produced at the second input terminal B of the window comparator WC after τ seconds from input of signal "y". Even if the height of this pulse signal $P_3'$ exceeds the threshold value ThBH of the second input terminal B, this does not cause any problems. This is because if, prior to generation of the signal $P_3'$, the input signal $Y_A$ of the first input terminal A exceeds the lower limit threshold value ThAL, then the rise of the signal $P_3'$ generated after τ seconds ($dP_3'/dt > 0$) or the fall thereof ($dP_3'/dt < 0$) comes between the range of the window given by the threshold values ThBH and ThBL, so that window comparator WC oscillates, enabling the signal to be self held (with an error of Δτ).

Figure 1:
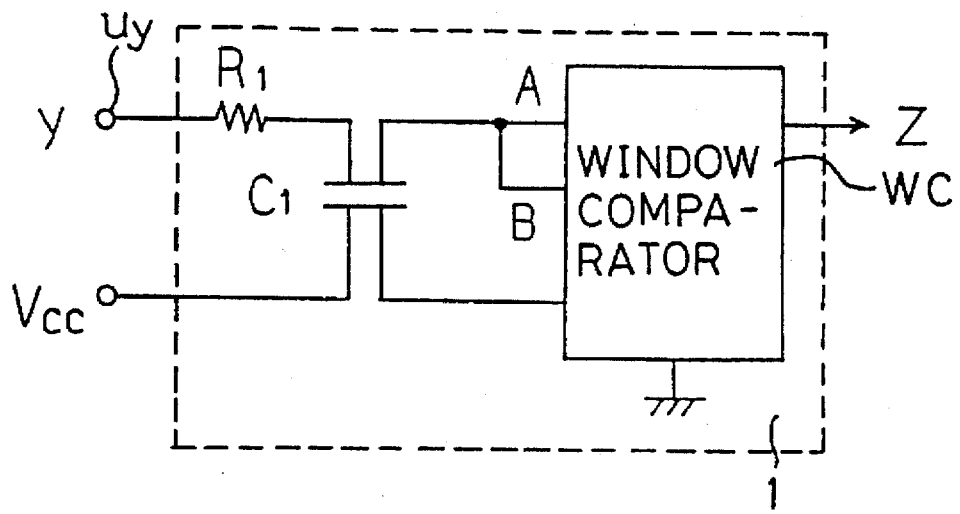
FIG. 1 is a circuit diagram illustrating an example of a conventional on-delay circuit.

Thus with an on-delay circuit wherein a delay circuit comprising the resistor $R_{221}$ and the four terminal capacitor $C_{221}$ of FIG. 1 is fitted in this way prior to the second input terminal A of the window comparator WC of the on-delay circuit 10 of FIG. 2, and upper and lower limit threshold values ThBH and ThBL for an error signal produced by a fault in the circuit and having a potential higher than the power source potential Vcc, are determined for the second input terminal B of the window comparator WC, then an on-delay circuit can be provided which can better prevent erring to the danger side due to circuit faults (errors shortening the delay time).

With the present invention, the input signal to the on-delay circuit must be at a direct current potential higher than the power source potential Vcc which drives the circuit. Such an input signal, that is, one of potential higher than the power source potential Vcc may be input simply by means of a switch. Another situation however involving input of an input signal of a potential higher than the power source potential Vcc is that wherein such potential is produced as a result of fail-safe signal processing. A fail-safe signal processing method has been previously described for example in relation to a magnetic sensor in a paper by M. Karo, K. Futsuhara, M. Mukaidono in the Proc. of 2nd International Conf. on Human Aspects of Advanced Manufacturing and Hybrid Automation, Honolulu, U.S.A. (August 1990), entitled "Construction of Magnetic Sensors for Assuring Safety". The theory forming the basis of fail-safe signal processing however is not described in detail. A method of fail-safe signal processing will therefore now be described using an example of a light beam sensor illustrated by FIG. 8.

Figure 8:
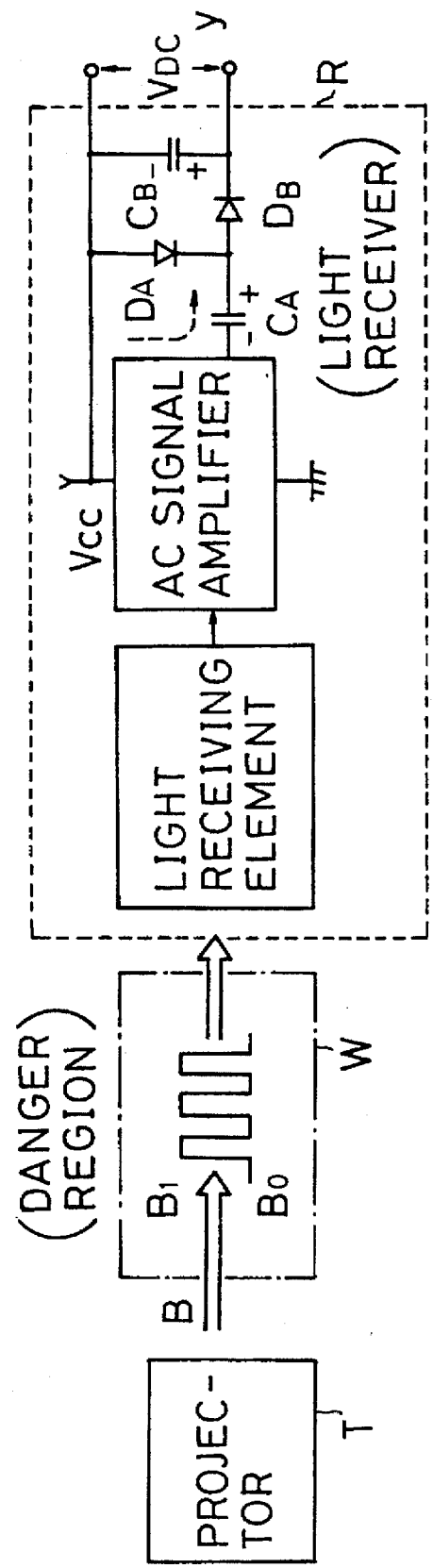
FIG. 8 is a diagram for explaining the principle of fail-safe signal processing.

In the construction of FIG. 8, a light beam B is projected from a projector T to a danger region W (region where safety is to be verified), and this light signal (alternating current) is received by a light receiver R. The light receiver R comprises a light receiving element, an amplifier for amplifying the output signal therefrom, and a rectifying circuit for rectifying the output signal from the amplifier.

The sensor of FIG. 8 carries out the following three important steps (1–3) discussed below, as a fail-safe steps.

(1) The input signal to the light receiver R is made an alternating current signal.

As shown by the oscillation between B1 and B0 in FIG. 8, the output signal of the projector T (light beam B) is transmitted to light receiver R, as an alternating signal, wherein a light present condition (B1) and a light absent condition (B0) are output alternately. With this method, from the point of view of the light receiver R side, a level of B1 (light present) implies that the light beam is not cut off by an obstacle (i.e. a safe condition) while a level of B0 (light absent) implies that the light beam is cut off by an obstacle (i.e. an unsafe condition). The light receiving element and the amplifier which constitute the light receiver R take this alternating signal and amplify it. Thus when an obstacle is actually in the region W, the alternating signal is not received, while when the obstacle is absent, the alternating signal is received. In other words with this method, even when there is no obstacle (i.e. a safe condition), the received signal indicating this also includes the signal (B0) indicating danger.

(2) The signal y=1 indicating safety is made a rectified output signal of the alternating current signal.

The output signal of the amplifier in FIG. 8 is rectified by a voltage doubler rectifying circuit to give a direct current output signal y=0. In FIG. 8, only after the input signal level B0 (indicating danger) is received by capacitor CA, a charge of the polarity shown in FIG. 8 takes place through a diode DA. Then the input signal level B1 (indicating safety) superimposes on this charging voltage and is stored in the capacitor CB through a diode DB as a direct current output voltage VDC. This stored voltage VDC is not produced as long as the capacitor CA is not being charged with the input signal level B0. That is, the direct current output voltage VDC indicating safety is only produced when the input signal level B0 indicating danger is received.

The receiving method illustrated by FIG. 8, can verify when generating the signal indicating safety (VDC), that the light receiving element and the amplifier are able to indicate danger. If this operation is expressed logically, then an output signal y=1 is produced by the logical product of; the region W is safe: and the light receiver R is able to indicate danger. If the input signal level B1 is not received, the direct current output voltage VDC is not produced, thus indicating danger. Therefore in FIG. 8, the alternating light beam B sent from the projector T checks whether or not there is an obstacle in the danger region W, and at the same time acts as a check signal for checking whether or not the light receiving element and the amplifier of the light receiver R are operating normally.

(3) The output signal is output at a level higher than the power source potential.

In FIG. 8, the voltage doubler rectifying circuit is clamped at the power source potential Vcc using the diode DA, and the signal "y" is output with the rectified output voltage VDC superimposed with the power source potential Vcc. The reason for generating an output signal superimposed in this way with the power source potential (referred to as an output signal of potential outside the power source frame) is that, even in an extreme case as shown by the dotted line in the FIG. 8 wherein a short circuit fault occurs in the capacitor CA so that the power source potential Vcc is output directly to the output side, then this can be distinguished at the output side, from the output potential VDC. That is to say, if in FIG. 8 the output potential of the voltage doubler rectifying circuit is V, then the binary output signal "y" is determined as follows;

$$y = 1, \quad V > Vcc$$
$$= 0, \quad V \leq Vcc$$

Thus, when an output potential higher than the power source potential Vcc (V>Vcc) is output this gives a signal y=1 indicating safety, while when an output potential equal to or lower than the power source potential Vcc (V≤Vcc) is output, this gives a signal y=0 indicating danger.

By giving the signal y binary in this way, then even in an extreme case wherein a short circuit fault occurs in the capacitor CA, and the power source potential Vcc is output to the output side, there is no erroneous generation of a signal y=1 indicating safety.

With the above example, the rectified output signal must be level tested using a threshold value of a level higher than the power source potential. Moreover, the circuit used for this level test must have the characteristics that; "there is never an occurrence of a level test output wherein, in spite of the input level being below the threshold value, due to a fault the output erroneously becomes as though a level higher than the threshold value has been input". A level test circuit having such functions is the fail safer window comparator to be described later.

The alternating current amplifier in FIG. 8 also must have fail-safe characteristics. Such an amplifier will now be described.

The normal transistor amplification level, is reduced due to a fault, but never increase more than 30%. At the time of a fault, the output signal is thus fixed to a certain level unless the transistor amplifier will not self oscillate. Because of this, with the fail-safe amplifier using an alternating current signal for the input signal, output of the alternating current signal as an output signal having a predetermined amplitude constitutes normal operation of the amplifier. This is because, in an extreme case, where a fault occurs in the amplifier, the output level becomes fixed at a certain value (level) does not become an alternating current output signal. The basic condition of this thinking is that the amplifier does not self oscillate. Consequently, a negative feedback amplifier is not really suitable as a fail-safe amplifier. A negative feedback amplifier however has the advantage that the amplifying level is hardly changed with temperature. The thinking is based on that the input signal level is small, and accordingly, due to a fault in the amplifier, the input signal is output directly to the output side without amplification, "since the output level is small, the output signal will not exceed the threshold value prepared for the output side."

Figure 9:
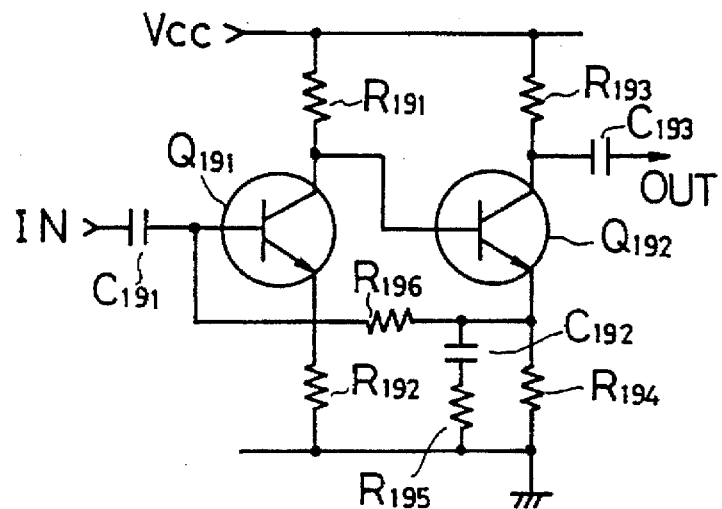
FIG. 9 is an example of a circuit for a fail-safe amplifier.

FIG. 9 shows an example of a fail-safe negative feedback amplifier (capable of amplifying to approximate 30 dB )

In FIG. 9, symbols R191, R192, R193, R194, R195, R196 indicate resistors, C191, C192, C193 indicate capacitors, while Q191, Q192 indicate transistors. The output signal is feedback from the emitter side of the transistor Q192 through the resistor R196 to the base of the transistor Q191. In the circuit of FIG. 9, if at first a disconnection fault occurs in the resistors R191, R192, R193, R194, R196, the output signal of the transistor Q192 becomes fixed at either a high or low output level. Similar output conditions also result when a short circuit fault occurs in the capacitor C192, since this will change the base bias of the transistor Q191 considerably. When a disconnection fault occurs in the capacitor C192 and a disconnection fault occurs in the resistor R195, the amplification level drops and the amplitude of the output from the transistor Q192 is reduced. However, when such a fault occurs, for fixing the output signal of the transistor Q192 at a constant level., then the construction can be that of FIG. 10.

Figure 10:
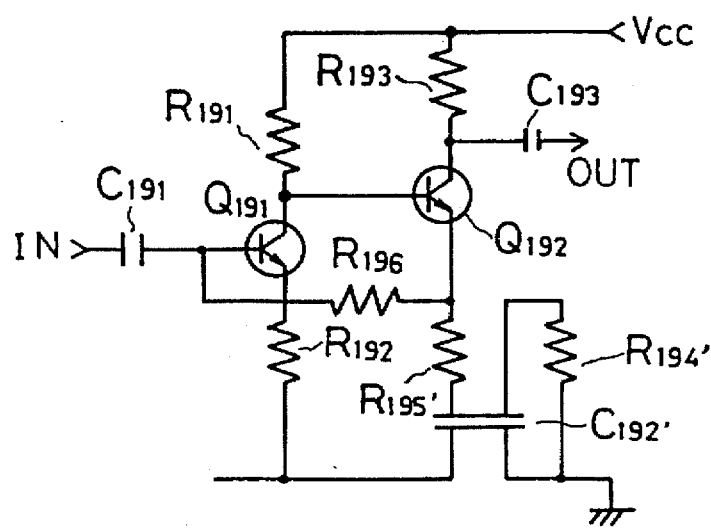
FIG. 10 is an example of a different circuit for a fail-safe amplifier.

In FIG. 10, with the exception of the resistors R194', R195', and the capacitor C192', the other elements are the same as those of FIG. 9.

In FIG. 9, the emitter resistance of the transistor Q192 with respect to the alternating current signal is the combined resistance of resistors R194 and R195 in parallel. The resistance of resistor R195' in FIG. 10 may be made approximately equal in size to this resistance. In FIG. 9, the emitter resistance of transistor Q192 with respect to a direct current signal is the resistance of resistor R194. In FIG. 10 the total resistance of resistors R195' and R194' may be made approximately equal to this size. In FIG. 10, a four terminal capacitor is used as the capacitor C192', so that even if a disconnection fault occurs in one of the resistors R194', R195', and even if a short circuit or a disconnection fault occurs in the capacitor C192', the output signal of the transistor Q192 is fixed at the specific direct current level.

Moreover, in FIG. 8, the output signal of the rectifier is generated by capacitor coupling. It is well known however that the output signal of the amplifier can be generated using transformer coupling as shown by the circuit of FIG. 11, and rectifying the secondary side output signal in a rectifying circuit.

Figure 11:
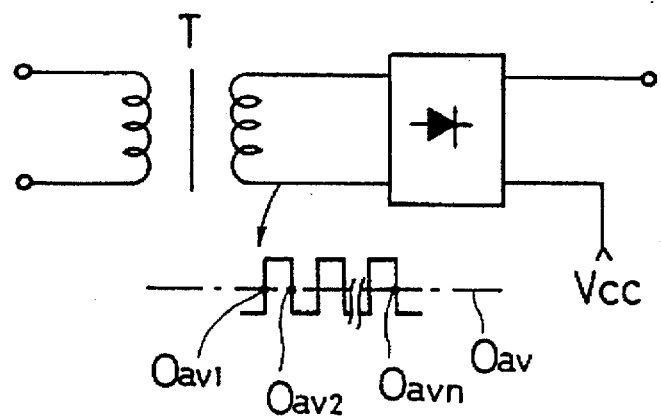
FIG. 11 is a circuit diagram for a case where an output signal of an alternating current amplifier is rectified by a transformer junction.

In the circuit of FIG. 11, the role of the coupling capacitor in FIG. 8 is carried by the transformer T. The secondary side output signal from the transformer T can be considered to prove by the average value level Oav of the amplitude of the alternating current output signal, as shown in FIG. 11 that a period when there is no alternating current input signal, that is to say the proof that a danger condition can be shown as the output signal of the transformer T. Passing through Oav1, . . . Oavn by the output signal of transformer T equals to that the field of the transformer T has changed. This proves that the input signal of the transformer T has changed to the side indicating danger.

The construction of the beforementioned two input window comparator used in the present invention, will now be described in detail.

The fail-safe window comparator circuit, its operation and fail-safe characteristics are disclosed in Trans. IEE of Japan Vol. 109-C, No. 9 September 1989 under the heading "A Construction Method for an Interlock System using a Fail-Safe Logic Element having Window Characteristics". Moreover this is also disclosed in literature such as the Proc. of 19th International Symp. on Multiple-Valued Logic, IEEE Computer Society (May 1989) under the heading of "Application of Window Comparator to Majority Operation", and the IEEE TRANSACTION on INSTRUMENTATION AND MEASUREMENT, Vol. 38, No. 2(April, 1989) under the heading of "Realization of Fail-Safe Train Wheel Sensor Using Electromagnetic Induction". Furthermore, a two input fail-safe window comparator incorporated in an LSI is disclosed in IEICE TRANS. ELECTRON., Vol, E76-C, No. 3, March 1993 PP. 419–427 under the heading of "LSI Implementation and Safety Verification of Window Comparator Used in Fail-Safe Multiple-Valued Logic Operation". The fail-safe window comparator circuit has also been previously disclosed by one of the present inventors in U.S. Pat. Nos. 4,661,880, 5,027,114 and in Japanese Examined Patent Publication No. 1-23006.

A representative circuit example and details of its operation will now be given.

Figure 12:
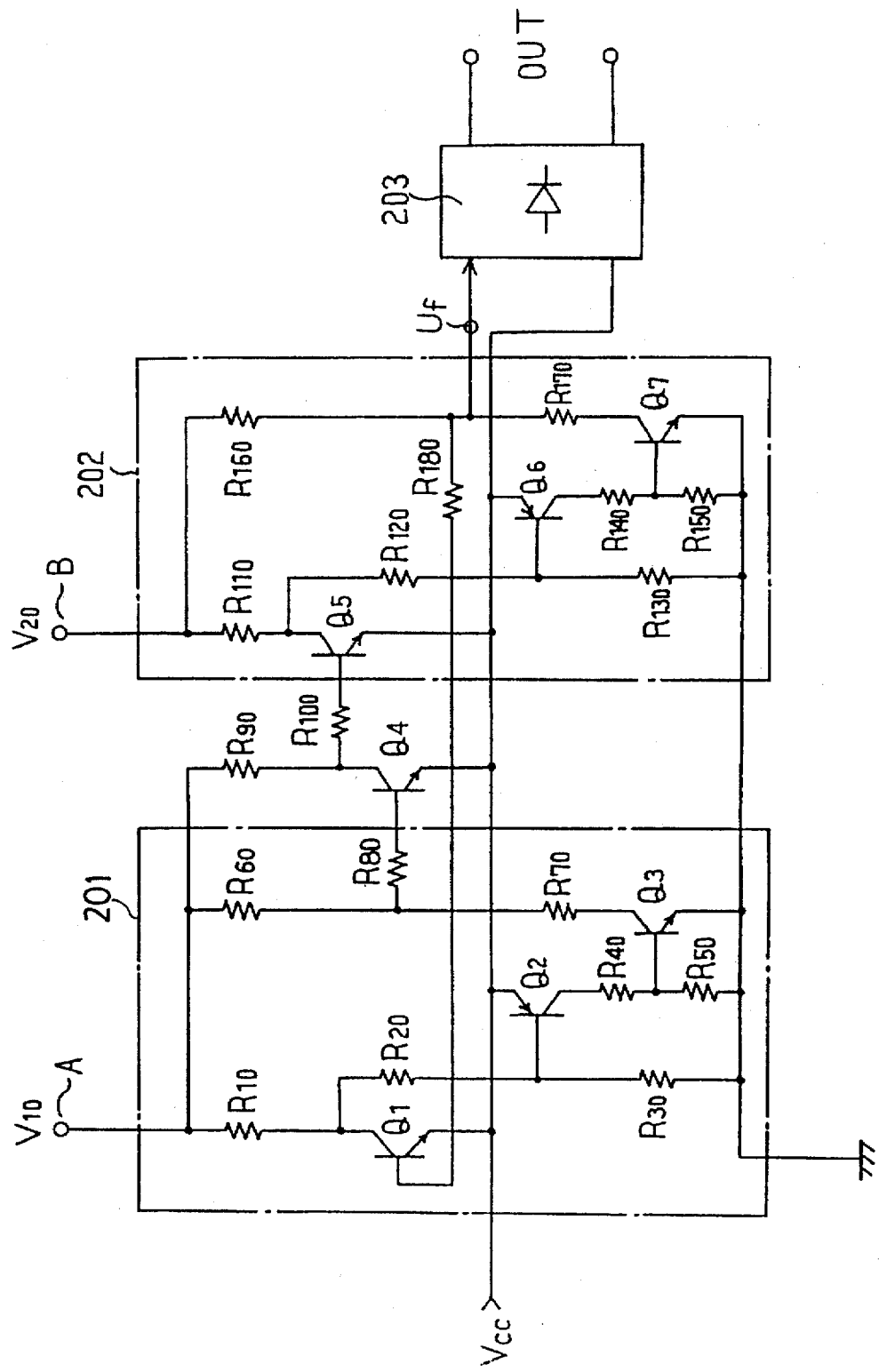
FIG. 12 is a circuit diagram of a two input window comparator applicable to the present invention.

FIG. 12 is a circuit diagram of a fail-safe window comparator. Since the circuit of FIG. 12 has a fail-safe logical product function this is a two input fail-safe window comparator/AND gate, to be precise.

In FIG. 12, symbols R10, R20 through R170, R180 indicate resistors, Q1 through Q7 indicate transistors, A, B indicate input terminals, Vcc indicates the power source potential for the window comparator, and numeral 203 indicates a rectifying circuit. The areas in FIG. 12 outlined by chain lines comprise direct-coupled direct current amplifying circuits 201, 202 which use respective transistors Q1, Q2, Q3, and Q5, Q6, Q7. Both have identical direct current amplifying circuit constructions. The circuits differ from a general direct current amplifying circuit in that the transistor Q1 and the transistor Q5 operates at a potential higher than the power source potential Vcc (the emitters of the NPN transistors Q1 and Q5 are connected to the power source potential Vcc). Consequently, an input signal having a voltage higher than the power source potential Vcc must be supplied to the bases of the transistors Q1 and Q5. The collectors of the transistors Q1 and Q5 are connected to the input terminals A, B through respective resistors R10 and R110. It will be apparent that as long as input signals higher than the power source potential Vcc (referred to as an input signal of potential outside the frame of the power source) are not supplied to the input terminals A, B, then the transistor Q1 and the transistor Q5 will not operate as amplifiers. Transistor Q4 constitutes a phase inversion circuit (inverter) and has an inverting amplification function on the output signal from the direct current amplifying circuit 201. Transistor Q4 also, as with transistors Q1 and Q5, operates with a base input potential and collector input potential (supplied from the input terminal A via resistor R90) higher than the power source potential Vcc. The base input signal to the transistor Q5 is supplied from the collector of the transistor Q4. Therefore if a signal of a higher input level than the power source potential Vcc is applied to the input terminal A, then a signal of a potential higher than the power source potential Vcc is supplied to the base of the transistor Q5.

The emitters of both transistors Q3 and Q7 are at earth potential, while the collectors are connected to the input terminals A and B by way of respective resistors R60, R70, and R160, R170. Consequently, if an input signal of a potential higher than the power source potential Vcc is applied to the input terminals A and B, then the collector potentials of the transistor Q3 and the transistor Q7 become earth potential when the transistors respectively come ON, and become the potential of the input terminals, that is potential higher than the power source potential Vcc, when the transistors respectively go OFF. Since the switch signal resulting from switching the transistor Q3 and the transistor Q7 on and off is respectively supplied to the base of the transistor Q4 by way of the resistor R80, and to the base of the transistor Q1 by way of the resistor R180, the transistor Q4 and the transistor Q1 can be respectively switched on and off using the output signal of the collector of the transistor Q3 and the output signal of the collector of the transistor Q7.

That is to say, the circuit of FIG. 12 constitutes a feedback oscillator, with the direct current amplifying circuit 201 direct-coupled to the direct current amplifying circuit 202 by way of the transistor Q4, and the output signal of the direct current amplifying circuit 202 direct-coupled to the direct current amplifying circuit 201 by way of the resistor R180.

Conditions for oscillation of the circuit of FIG. 12 are determined by the following equations, where V10 is the input potential of the input terminal A, and V20 is the input potential of the input terminal B;

For the input terminal A $$(r_{10}+r_{20}+r_{30})\ Vcc/r_{30} \leq V_{10} \leq (r_{60}+r_{70})\ Vcc/r_{70} \quad (1)$$

For the input terminal B, $$(r_{110}+r_{120}+r_{130})\ Vcc/r_{130} \leq V_{20} \leq (r_{160}+r_{170})\ Vcc/r_{170} \quad (2)$$

In the above two equations, $r_{10}$ through $r_{170}$ indicate the resistance values of the respective resistors. Moreover, symbol "$\leq$" means less than or approximately equal. In equation (1) $(r_{10}+r_{20}+r_{30})\ Vcc/r_{30}$ represents the approximate lower limit threshold value of the input terminal A, while $(r_{60}+r_{70})\ Vcc/r_{70}$ represents the approximate upper limit threshold value of the input terminal A. In a similar manner, $(r_{110}+r_{120}+r_{130})\ Vcc/r_{130}$ in equation (2) represents the approximate lower limit threshold value of the input terminal B, while $(r_{160}+r_{170})\ Vcc/r_{170}$ represents the approximate upper limit threshold value of the input terminal B. When the input terminal A has an input level $V_{10}$ within a range satisfying equation (1), and the input terminal B has an input level $V_{20}$ within a range satisfying equation (2), the circuit of FIG. 12 oscillates and an alternating current output signal is produced at terminal Uf. This alternating current output signal is rectified in the rectifying circuit 203 to become a direct current output signal (if an alternating current output signal is not generated at the terminal Uf, then a direct current output signal is not produced).

The oscillation process in the circuit of FIG. 12 occurs when the voltage levels of the input signals to the input terminals A and B both satisfy equations (1) and (2), with the transistors Q1 to Q7 being switched for example as described below.

At first with no input voltage supplied to either of the input terminals A or B, the state of the respective transistors is; transistor Q1:OFF, transistor Q2:ON, transistor Q3:ON, transistor Q4:OFF, transistor Q5:OFF, transistor Q6:ON, and transistor Q7:ON.

Then when an input voltage which satisfies equation (1) (a voltage within the threshold value range having upper and lower limits expressed by equation (1)) is supplied to the input terminal A, the state of the respective transistors becomes; transistor Q1:OFF, transistor Q2:OFF, transistor Q3:OFF, transistor Q4:ON, transistor Q5:OFF, transistor Q6:ON, and transistor Q7:ON. In this case, the output conditions of the transistors Q2, Q3, Q4, are switched and changed by the input signal of the input terminal A. However since an input voltage lower than the lower limit threshold value expressed by equation (2) is supplied to the input terminal B, the output conditions of the transistors Q5, Q6, Q7 and Q1 do not change. Consequently, even if a signal of a predetermined threshold value level is input to only one of the input terminals, the circuit of FIG. 12 does not oscillate.

Subsequently when an input voltage satisfying equation (2) (a voltage within the threshold value range having upper and lower limits expressed by equation (2)) is supplied to the input terminal B, while the input voltage satisfying equation (1) is being input to the input terminal A, the circuit oscillates with the respective transistors being switched in the following manner: Q6:OFF→Q7:OFF→Q1:ON→Q2:ON→Q3:ON→Q4:OFF→Q5:ON→Q6:ON→Q7:ON→Q1:OFF→Q2:OFF→Q3:OFF→Q4:ON→Q5:OFF→Q6:OFF→ and so on.

Here the upper and lower threshold value interval (width) for the input terminals A and B expressed by equations (1) and (2) is called a window, and the comparator illustrated by FIG. 12 having such upper and lower threshold values for the input level is called a window comparator.

Since the circuit of FIG. 12 oscillates only when direct current input voltages which respectively satisfy equations (1) and (2) are supplied to the input terminals A and B, and can thus generate an alternating current output signal, it has the function of an AND gate. Moreover, since either of the input terminals A and B has a function of a window comparator, the circuit is called a two input window comparator/AND gate. Setting the window in the window comparator, has the meaning in FIG. 12, of setting the upper and lower threshold values of the input terminals A or B, with respect to an input level.

The circuit of FIG. 12, has the characteristic that if any one of the transistors Q1 (i=1~7) is faulty (for example if an short circuit fault occurs between the base and collector of the transistor), then the phase of the feedback loop is inverted so that a feedback oscillation cannot be produced. Moreover, insofar as a voltage which is higher than the power source potential Vcc, is not supplied through the respective input terminals A and B to the collector side of the transistors Q1, Q3, Q4 and transistors Q5, Q7, then switching signals cannot be output to the bases of the transistors succeeding these transistors (respective transistors Q2, Q4, Q5 and transistors Q6, Q1). The circuit of FIG. 12, thus has the characteristic that even with faults occurring in a plurality of the transistors (even a short circuit occurring between the base and collector of a plurality of the transistors) then as long as input signals (input signals satisfying equations (1) and (2)) higher than the power source voltage are not supplied to both input terminals A, B, it cannot oscillate. Moreover, in the case of a disconnection fault in the resistors which determine the oscillation threshold value (the resistances which determine equation (1) and equation (2)), the circuit of FIG. 12 has the characteristic that it cannot oscillate (similarly even if a short circuit fault occurs it cannot oscillate). In other words, even in the worst case scenario where a short circuit or disconnection fault occurs in the transistors and resistors which make up the circuit, the circuit of FIG. 12 has the characteristic that; "there is no situation wherein in spite of an input voltage determined by equations (1) and (2) being not supplied to at least both the input terminals A and B oscillation erroneously occurs". Consequently, the circuit of FIG. 12 is referred to as a fail-safe window comparator/AND gate.

The rectifying circuit 203 of FIG. 12 has the function of rectifying the AC output signal produced by oscillation of the direct current amplifying circuit 202, to give a direct current output signal. The method of rectifying the oscillating output signal to give a direct current output signal also includes amplifying the output signal of the oscillation circuit of FIG. 12 before input to the rectifying circuit. Moreover, in FIG. 12, a phase inverter amplifying circuit comprising the transistor Q4 is inserted between but separate from the two direct current amplifying circuits 201, 202 as an inverter. This phase inverter amplifying circuit however may be incorporated into one of the two direct current amplifying circuits (for example as disclosed in the beforementioned literature such as the IEICE TRANS. ELECTRON., Vol., E76-C, No. 3, March 1993).

Figure 13:
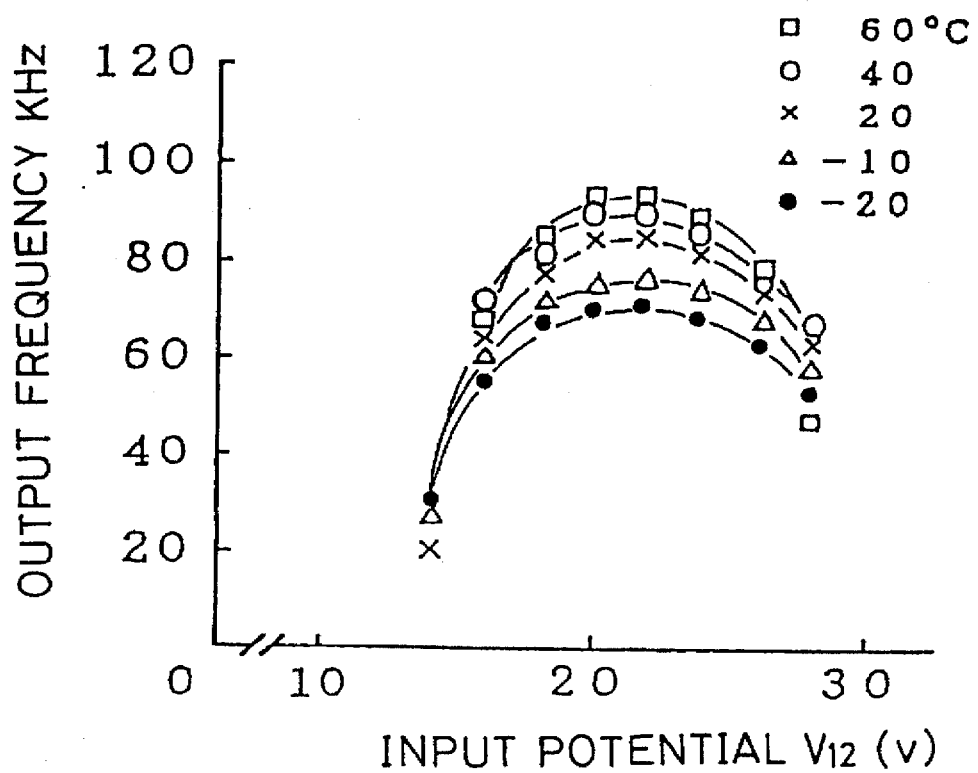
FIG. 13 is a characteristic curve for the window comparator of FIG. 12.

FIG. 13 shows the oscillation frequency characteristics for the circuit of FIG. 12, with respect to the input voltage V12 (=V10=V20) for the case where common inputs signals are applied to input terminals A and B, and the threshold values determined by equations (1) and (2) are set to equal values, and where; $r_{10}=r_{110}=r_{70}=16$ KΩ, $r_{60}=r_{160}=20$ KΩ, $r_{30}=r_{130}=100$ KΩ, $r_{20}=r_{120}=6.2$ KΩ, $r_{40}=r_{140}=10$ KΩ, $r_{50}=r_{150}=1$ KΩ, $r_{90}=20$ KΩ, $r_{80}=r_{100}=r_{180}=20$ KΩ.

With the on-delay circuit of the present invention as described above, even if a fault occurs for example in a resistor, capacitor or the PUT making up the circuit, the pre-set delay time is never shortened, so that it has extremely high fail-safe characteristics.

INDUSTRIAL APPLICABILITY

With industrial machinery requiring a high degree of safety, and wherein an on-delay circuit is used for example as a time control device, the present invention enables extremely high safety to be maintained, and thus has considerable industrial applicability.

We claim:

1. An on-delay circuit comprising:
    a PUT oscillation circuit for generating an oscillating pulse from a cathode terminal of a PUT (programmable uni-junction transistor) after a predetermined time period from applying a signal to a signal input terminal of said PUT oscillation circuit,
    a level conversion circuit for level converting a signal level of the oscillating pulse from the cathode terminal of said PUT oscillation circuit and providing a level converted output,
    a two input window comparator for generating an output of logic value 1 when:
        the signal input through the signal input terminal of said PUT oscillation circuit is applied to a first input terminal of said two input window comparator;
        a rising differential signal of the level converted output from said level conversion circuit is applied to a second input terminal of said two input window comparator; and
        signals of a level higher than a power source potential are input to said first and second input terminals of said two input window comparator, and
    a self holding circuit which feeds back a rectified output of said two input window comparator to said second input terminal of said two input window comparator, to thereby maintain the output of said two input window comparator, wherein said PUT oscillation circuit comprises:
a first resistor and a capacitor connected to each other in a first series circuit, said first series circuit being connected between the signal input terminal and an ungrounded power supply line providing said power source potential to the two input window comparator, and a second resistor and a third resistor connected to each other in a second series circuit, said second series circuit being connected in parallel with said first series circuit including said first resistor and said capacitor, and wherein an anode terminal of the PUT is connected to an intermediate point between said first resistor and said capacitor, a gate terminal of the PUT is connected to an intermediate point between said second resistor and said third resistor, and the cathode terminal of the PUT is connected through a fourth resistor to said power supply line, and an output is generated from an intermediate point between the cathode terminal of the PUT and the fourth resistor.

2. An on-delay circuit comprising:

a PUT oscillation circuit for generating an oscillating pulse from a cathode terminal of a PUT (programmable uni-junction transistor) after a predetermined time period from applying a signal to a signal input terminal of said PUT oscillation circuit, a level conversion circuit for level converting a signal level of the oscillating pulse from the cathode terminal of said PUT oscillation circuit and providing a level converted output, a two input window comparator for generating an output of logic value 1 when:
the signal input through the signal input terminal of said PUT oscillation circuit is applied to a first input terminal of said two input window comparator;
a rising differential signal of the level converted output from said level conversion circuit is applied to a second input terminal of said two input window comparator; and
signals of a level higher than a power source potential are input to said first and second input terminals of said two input window comparator, and a self holding circuit which feeds back a rectified output of said two input window comparator to said second input terminal of said two input window comparator, to thereby maintain the output of said two input window comparator, wherein said level conversion circuit has a fifth resistor and a sixth resistor for dividing a voltage of said oscillating pulse from the PUT oscillation circuit, and incorporates a PNP transistor, said PNP transistor having an emitter connected to a power supply line providing said power source potential of the two input window comparator, a collector connected through a seventh resistor to earth, and a base connected to an intermediate point between the fifth resistor and the sixth resistor, and said level converted output representing a signal generated at an intermediate point between the collector and the seventh resistor.

3. An on-delay circuit comprising:

a PUT oscillation circuit for generating an oscillating pulse from a cathode terminal of a PUT (programmable uni-junction transistor) after a predetermined time period from applying a signal to a signal input terminal of said PUT oscillation circuit, a level conversion circuit for level converting a signal level of the oscillating pulse from the cathode terminal of said PUT oscillation circuit and providing a level converted output, a two input window comparator for generating an output of logic value 1 when:
the signal input through the signal input terminal of said PUT oscillation circuit is applied to a first input terminal of said two input window comparator;
a rising differential signal of the level converted output from said level conversion circuit is applied to a second input terminal of said two input window comparator; and
signals of a level higher than a power source potential are input to said first and second input terminals of said two input window comparator, and a self holding circuit which feeds back a rectified output of said two input window comparator to said second input terminal, to thereby maintain the output of said two input window comparator, wherein:
a resistor and a four terminal capacitor are connected to the first input terminal of the two input window comparator which receives the signal input through the signal input terminal of said PUT oscillation circuit one end of the resistor being connected to the signal input terminal of the PUT oscillation circuit;
said four terminal capacitor having two terminals of one electrode plate connected to another end of the resistor and to the first input terminal of the window comparator,
said four terminal capacitor having two terminals of a second electrode plate connected between a power supply line providing the power source potential and the window comparator, and
wherein predetermined threshold value ranges are set which define an upper limit value and a lower limit value for input signal levels for the two input terminals of the two input window comparator.

4. An on-delay circuit comprising:

a PUT oscillation circuit for generating an oscillating pulse from a cathode terminal of a PUT (programmable uni-junction transistor) after a predetermined time period from applying a signal to a signal input terminal of said PUT oscillation circuit, a level conversion circuit for level converting a signal level of the oscillating pulse from the cathode terminal of said PUT oscillation circuit and providing a level converted output, a two input window comparator for generating an output of logic value 1 when:
the signal input through the signal input terminal of said PUT oscillation circuit is applied to a first input terminal of said two input window comparator;
a rising differential signal of the level converted output from said level conversion circuit is applied to a second input terminal of said two input window comparator; and
signals of a level higher than a power source potential are input to said first and second input terminals of said two input window comparator, wherein said power source potential is drawn from an ungrounded power supply line, said level conversion circuit comprising a switching device having a pair of main terminals and a control terminal, said main terminals respectively connected to said power source potential and to a power source return terminal, and said control terminal connected to receive the oscillating pulse from the cathode terminal of said PUT oscillation circuit; and a self holding circuit which feeds back a rectified output of said two input window comparator to said second input terminal of said two input window comparator, to thereby maintain the output of the window comparator.

5. An on-delay circuit according to claim 1, wherein said level conversion circuit is connected for reducing the signal level of the oscillating pulse from a level higher than the power source potential to a level within a range between the power source potential and ground.

\* \* \* \* \*